(12) United States Patent
Moon et al.

(10) Patent No.: US 10,096,736 B1
(45) Date of Patent: Oct. 9, 2018

(54) P-TYPE CHALCOGENIDE AND N-TYPE SILICON HETEROJUNCTION INFARED PHOTODIODES AND METHOD OF MANUFACTURING THEREOF

(71) Applicant: HRL Laboratories, LLC, Malibu, CA (US)

(72) Inventors: Jeong-Sun Moon, Moorpark, CA (US); Hwa Chang Seo, Torrance, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 15/900,738

(22) Filed: Feb. 20, 2018

Related U.S. Application Data

(62) Division of application No. 15/406,566, filed on Jan. 13, 2017, now Pat. No. 9,954,133.

(60) Provisional application No. 62/279,525, filed on Jan. 15, 2016.

(51) Int. Cl.
| | |
|---|---|
| *H01L 21/00* | (2006.01) |
| *H01L 31/109* | (2006.01) |
| *H01L 31/02* | (2006.01) |
| *H01L 45/00* | (2006.01) |
| *H01L 31/18* | (2006.01) |
| *H01L 31/0216* | (2014.01) |
| *H01L 31/0336* | (2006.01) |
| *H01L 31/0272* | (2006.01) |

(52) U.S. Cl.
CPC ...... *H01L 31/109* (2013.01); *H01L 31/02005* (2013.01); *H01L 31/0272* (2013.01); *H01L 31/02161* (2013.01); *H01L 31/0336* (2013.01); *H01L 31/1892* (2013.01); *H01L 45/06* (2013.01); *H01L 45/144* (2013.01)

(58) Field of Classification Search
CPC .......... H01L 21/02417; H01L 21/0248; H01L 31/109; H01L 31/02005; H01L 31/02161
USPC ......................................... 438/24, 57, 84, 95
See application file for complete search history.

(56) References Cited

U.S. PATENT DOCUMENTS

| | | | | |
|---|---|---|---|---|
| 4,207,119 | A * | 6/1980 | Tyan | H01L 31/073 136/258 |
| 8,791,542 | B2 * | 7/2014 | Toriyama | H01L 31/1055 257/184 |
| 2006/0261364 | A1 | 11/2006 | Suehiro et al. | |
| 2011/0214736 | A1 * | 9/2011 | Lee | H01L 29/18 136/258 |
| 2013/0260527 | A1 | 10/2013 | Carter | |
| 2013/0306927 | A1 | 11/2013 | Marsh et al. | |

OTHER PUBLICATIONS

Ethan Klem et al., "High performance SWIR sensing from colloidal quantum dot photodiode arrays", Proc. of SPIE vol. 8868, 886806-01, 2013.
H.-W. Shin et al., "Short-wavelength infrared photodetector on Si employing strain-induced growth of very tall InAs nanowire arrays", Nature, 2015.

(Continued)

*Primary Examiner* — David S Blum
(74) *Attorney, Agent, or Firm* — Ladas & Parry

(57) ABSTRACT

A photodetector comprising a region of a p-type phase-change chalcogenide material forming a heterojunction with a region of n-type Silicon; wherein the p-type phase-change chalcogenide material comprises one of GeTe and SbTe.

15 Claims, 6 Drawing Sheets

(56) References Cited

OTHER PUBLICATIONS

J. Yao et al., "Ultra-broadband and high response of the Bu2Te3—Si heterojunction and its application as a photodetector at room temperature in harsh working environments", Nanoscale, vol. 7, p. 1235, 2015.
EE Times, Nov. 2011, "Samsung preps 8-Gbit phase-change memory".
Perniola et al , "Electrical behavior of phase change memory cells based on GeTe", IEEE EDL., vol. 31, p. 488, (2010).

* cited by examiner

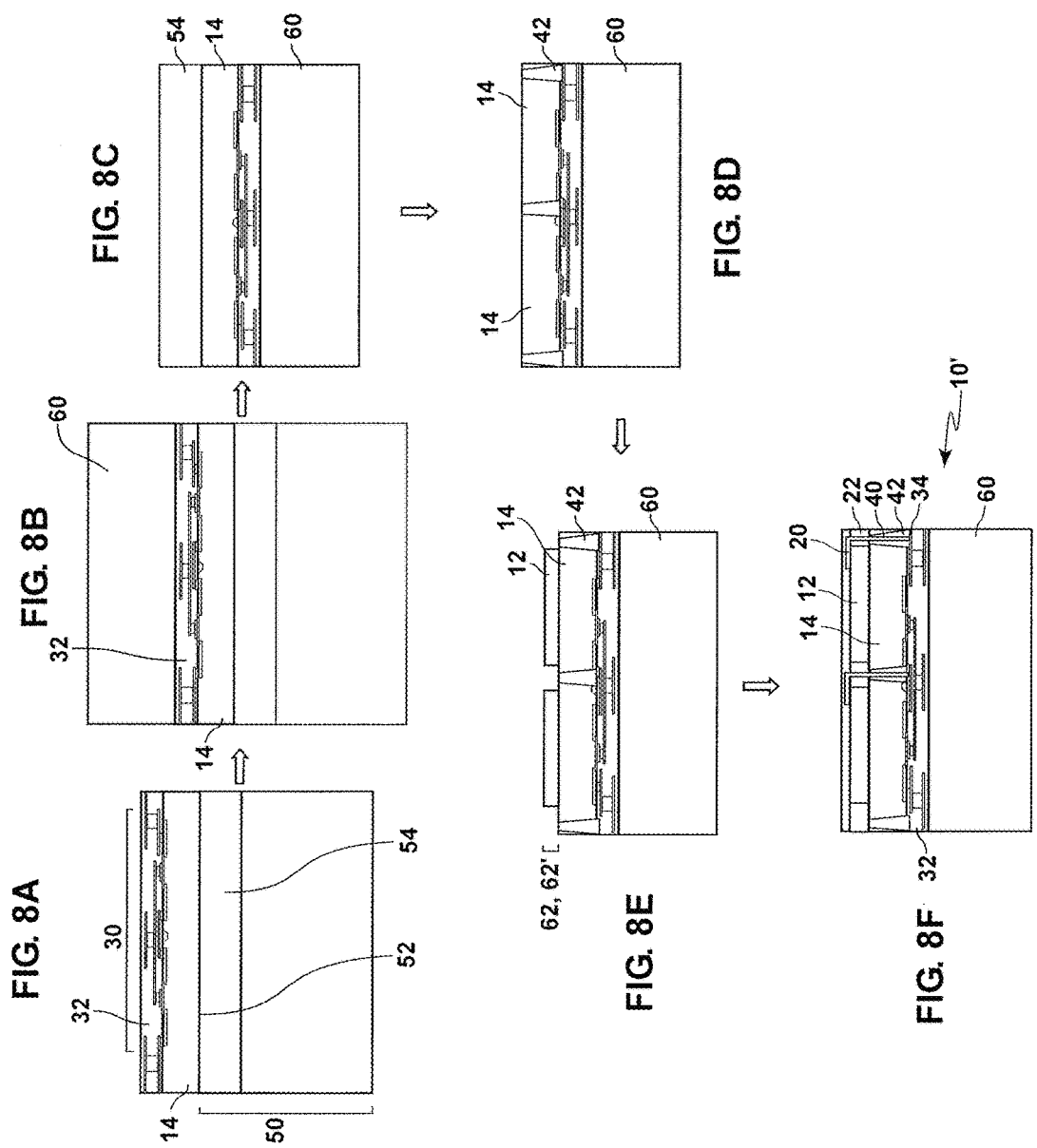

US 10,096,736 B1

P-TYPE CHALCOGENIDE AND N-TYPE SILICON HETEROJUNCTION INFARED PHOTODIODES AND METHOD OF MANUFACTURING THEREOF

CROSS REFERENCE TO RELATED APPLICATION

This application claims the benefit of and is a divisional of U.S. patent application Ser. No. 15/406,566, filed on Jan. 13, 2017, which claims priority to U.S. Provisional Application No. 62/279,525, filed on Jan. 15, 2016, the disclosure of which is incorporated herein by reference.

TECHNICAL FIELD

This presentation is directed in general to the field of photodiodes and in particular infrared sensor photodiodes.

BACKGROUND

Known infrared photodetectors include Silicon Optical Amplifiers (SOA) and Short-wave Infrared (SWIR) cameras that are made of crystalline Indium-Gallium Arsenide (InGaAs) semiconductors that are complex and expensive to manufacture. Attempts to reduce the cost of SWIR camera have been made to obtain SWIR spectral range having CMOS process compatibility.

The reference "*High performance SWIR sensing fomr colloidal quantum dot photodiode arrays*" (Ethan Klem et al., Proc. Of SPIE vol., 8868, 886806-01, 2013) discloses an attempt at direct fabrication on CMOS wafers using Lead Sulfide (PbS) colloidal quantum dots in SWIR: p-PbS/n-$C_{60}$ (p-doped Lead-Sulfide on n-doped Carbon) heterojunction detectors, having at room temperature an external quantum efficiency (QE) of 21% at Vd=0V bias under 850 nm illumination of 1 mW/$cm^2$. The dark current density was rather high at 137 nA/$cm^2$ at −20 mV bias. Alternatively, the reference "Short-wavelength infrared photodetector on Si employing strain-induced growth of very tall InAs nanowire arrays" (W. Shin et al., Nature, 2015) discloses making Indium Arsenide (InAs) nanowires for SWIR detection but with a poor detectivity of 1e5 cm$Hz^{1/2}$/W and a dark current density of 1e7 nA/$cm^2$ at 220 K.

A Bismuth Tellurium on Silicon ($Bi_2Te_3$/Si) heterojunction photodetector was disclosed in the reference "*Ultrabroadband and high response of the Bi2Te3-Si heterojunction and its application as a photodetector at room temperature in harsh working environments*" (J. Yao et al., Nanoscale, vol. 7, p. 1235, 2015), where the $Bi_2Te_3$ was used as a topological insulator for THz detection (see FIG. 1). Due to its low-bandgap, IR detection was feasible with detection of 1.55 μm IR, but a disadvantage of this heterojunction photodetector was its low responsivity and high dark current density. Further, this reference taught using a pulsed-laser deposition technique to form the Bi2Te3 layer.

What is urgently needed in the field of infrared detectors is an infrared (IR) photodetector that will overcome the limitations described above, and with improvements in quantum efficiency, with substantially reduced dark density and with good detectivity.

SUMMARY

To address one or more of the above-deficiencies of the prior art, one embodiment described in this presentation relates to a chalcogenide based infrared photodiode comprising a n-doped substrate, a layer of p-doped chalcogenide material over the n-doped substrate forming a heterojunction and a layer of metal contacts thermally connected to the p-doped chalcogenide material, wherein the metal contacts are configured to effectuate a phase-change of the p-doped chalcogenide material.

According to an embodiment of this presentation, the chalcogenide material is p-GeTe.

According to an embodiment of this presentation, the chalcogenide material is p-$Ge_{0.5}Te_{0.5}$.

According to an embodiment of this presentation, the chalcogenide material is p-$Sb_2TE_3$.

According to an embodiment of this presentation, n-doped substrate is n-Si.

According to an embodiment of this presentation, the n-doped substrate is selected from Titanium-Tungsten, Aluminum and Silicon dioxide.

According to an embodiment of this presentation, the phase-change of the chalcogenide material changes phase from amorphous to crystalline.

According to an embodiment of this presentation, the chalcogenide is annealed at 200 degrees C. to form a crystalline material. According to an embodiment of this presentation, a crystalline GeTe chalcogenide requires a temperature of 723 degrees C. to return to an amorphous state and a crystalline SbTe chalcogenide requires a temperature of 540 degrees for SbTe to return to an amorphous state.

According to an embodiment of this presentation, the photodiode/photodetector further comprises a layer of anti-reflective coating on top of the p-doped chalcogenide material.

According to an embodiment of this presentation, the metal contacts are formed with a layer of copper.

An embodiment of this presentation comprises a method of making an infrared photodiode is also disclosed, comprising depositing a layer of dielectric material on a n-doped substrate, etching a cavity in the dielectric layer exposing the n-doped substrate, depositing a layer of p-doped chalcogenide material in the cavity and depositing a metal layer to create a pair of metal contacts, wherein the metal contacts are configured to effectuate a phase-change of the p-doped chalcogenide material.

According to an embodiment of this presentation, the chalcogenide material is p-GeTe.

According to an embodiment of this presentation, the chalcogenide material is p-$Ge_{0.5}Te_{0.5}$.

According to an embodiment of this presentation, the chalcogenide material is p-$Sb_2Te_3$.

According to an embodiment of this presentation, the n-doped substrate is n-Si.

According to an embodiment of this presentation, the n-doped substrate is selected from Titanium-Tungsten, Aluminum and Silicon dioxide.

According to an embodiment of this presentation, the phase-change of the chalcogenide material changes phase from amorphous to crystalline.

According to an embodiment of this presentation, the phase-change of the chalcogenide material occurs around 200-degree C.

According to an embodiment of this presentation, the method further comprises depositing a layer of anti-reflective coating on top of the p-doped chalcogenide material.

According to an embodiment of this presentation, the metal contacts are formed with a layer of copper.

Certain embodiments may provide various technical advantages depending on the implementation. For example, a technical advantage of some embodiments may include the capability to effectuate a phase-change at a lower temperature. Other embodiments may provide for a higher detector current. Some embodiments may operate in near-infrared (NIR) spectrum. Other embodiments may operate in short-wave infrared (SWIR) spectrum.

Embodiments of this presentation relate to a device and a method are for infrared (IR) photodetectors made of p-type phase-change chalcogenides, that include using p-doped chalcogenide materials such as Germanium-Tellurium ($Ge_{0.5}Te_{0.5}$) and Antimony-Tellurium ($Sb_2Te_3$), on n-type silicon forming a heterojunction and use phase-transition to improve material quality of GeTe and $Sb_2Te_3$ on silicon substrate. With p-type phase-change chalcogenide ($Ge_{0.5}Te_{0.5}$ and $Sb_2Te_3$) on n-doped silicon forming a heterojunction, the IR photodetectors operate in the near-IR (NIR) and short-wave IR (SWIR) spectral range. Other chalcogenides and other substrate materials can be used to create the required heterojunction and effectuate the phase change.

Embodiments of this presentation relate to a photodetector comprising: a region of a p-type phase-change chalcogenide material forming a heterojunction with a region of n-type Silicon; wherein the p-type phase-change chalcogenide material comprises one of GeTe and SbTe.

According to an embodiment of this presentation, the region of p-type phase-change chalcogenide material has a thickness comprised between 0.2 µm and 1 µm.

According to an embodiment of this presentation, the photodetector operates in the near-IR and short-wave IR spectral ranges According to an embodiment of this presentation, the region of p-type phase-change chalcogenide material comprises a bottom surface in contact with a top surface of the region of n-type Silicon; a portion of a bottom surface of the region of n-type Silicon being in contact with a first electrode; and a portion of a top surface of the region of p-type phase-change chalcogenide material being in contact with a second electrode.

According to an embodiment of this presentation, the region of p-type phase-change chalcogenide material comprises lateral sides surrounded by a dielectric material region, said second electrode being in contact with a portion of a top surface of said dielectric material region.

According to an embodiment of this presentation, at least the portion of the top surface of the region of p-type phase-change chalcogenide material that is not in contact with the second electrode is covered by an anti-reflection coating.

According to an embodiment of this presentation, the anti-reflection coating comprises Ge or ZnSe.

According to an embodiment of this presentation, a portion of the bottom surface of the region of n-type Silicon comprises an integrated circuit electrically connected to said first electrode.

According to an embodiment of this presentation, said second electrode is electrically connected to said integrated circuity by an isolated via.

According to an embodiment of this presentation, the bottom surface of the region of n-type Silicon is covered by a dielectric layer.

According to an embodiment of this presentation, said dielectric layer comprises at least one conductor electrically connected to said integrated circuit.

According to an embodiment of this presentation, a bottom surface of said dielectric layer is attached to a carrier wafer.

An embodiment of this presentation relates to a method of manufacturing a photodetector, the method comprising: providing a region of n-type Silicon having top and bottom surfaces; and forming one of a layer of crystalline p-type phase-change chalcogenide material and a layer of polycrystalline p-type phase-change chalcogenide material on the top surface of the region of n-type Silicon.

According to an embodiment of this presentation, said forming one of a layer of crystalline p-type phase-change chalcogenide material and a layer of polycrystalline p-type phase-change chalcogenide material on the top surface of the region of n-type Silicon comprises: sputtering at room temperature a layer of an amorphous p-type phase-change chalcogenide material on the top surface of the region of n-type Silicon; and increasing the temperature until structural phase transition transforms the layer of amorphous p-type phase-change chalcogenide material into one of a layer of crystalline p-type phase-change chalcogenide material and a layer of polycrystalline p-type phase-change chalcogenide material.

According to an embodiment of this presentation, the p-type phase-change chalcogenide material comprises one of GeTe and SbTe.

According to an embodiment of this presentation, said providing a region of n-type Silicon having top and bottom surfaces comprises: providing a first substrate having a work surface; and forming said region of n-type Silicon on said work surface of the first substrate, wherein the top surface of said region of n-type Silicon is in contact with the work surface of the substrate and the bottom surface of said region of n-type Silicon is exposed; forming an integrated circuit in the bottom surface of said region of n-type Silicon; said integrated circuit being electrically coupled to a first electrode of said photodetector; forming a dielectric layer on the bottom surface of said region of n-type Silicon; attaching a second substrate to the dielectric layer; and removing the first substrate to expose the top surface of said region of n-type Silicon.

According to an embodiment of this presentation, said dielectric layer comprises at least one conductor electrically connected to said integrated circuit.

According to an embodiment of this presentation, the method further comprises forming an insulated via between said integrated circuit and a top surface of the p-type phase-change chalcogenide material; and forming on the top surface of the p-type phase-change chalcogenide material a second electrode of said photodetector in contact with the via.

According to an embodiment of this presentation, the method further comprises covering the layer of p-type phase-change chalcogenide material with an anti-reflection material.

According to an embodiment of this presentation, the anti-reflection coating comprises Ge or ZnSe.

Although specific advantages have been enumerated above, various embodiments may include some, none, or all of the enumerated advantages. Additionally, other technical advantages may become readily apparent to one of ordinary skill in the art after review of the following figures and description.

BRIEF DESCRIPTION OF THE DRAWINGS

For a more complete understanding of this presentation and its advantages, reference is now made to the following description taken in conjunction with the accompanying drawings, in which like reference numerals represent like parts:

FIGS. 8A to 8F illustrates a method of manufacturing of the photodetector of FIG. 7.

DETAILED DESCRIPTION

It should be understood at the outset that, although example embodiments are illustrated below, the present technology may be implemented using any number of techniques, whether currently known or not. The present technology should in no way be limited to the example implementations, drawings, and techniques illustrated below. Additionally, the drawings are not necessarily drawn to scale.

A chalcogenide is a compound containing selenium (Se), Tellurium (Te), or Sulfur (S), which has been used in various photonic applications including photovoltaic solar cells. Currently, thin film solar cells made of Copper-Indium-Gallium-Selenium (Cu(In,Ga)Se2), or Cadmium-Tellurium-Cadmium Sulphide (CdTe/CdS) compounds are made. The principal of phase change materials (PCMs) was known in the 1960s, particularly for their application in rewritable optical DVDs having been developed using Germanium-Antimony-Tellurium ($Ge_2Sb_2Te_5$) or Silver-Indium-Antimony-Tellurium ($(Ag, In)Sb_2Te$). Lately, PCMs have been developed for non-volatile memory as a future replacement for flash memory in the Integrated Circuit (IC) industry by companies such as Micron, Samsung, IBM, STMicroelectronics, and Intel.

Figure 1:
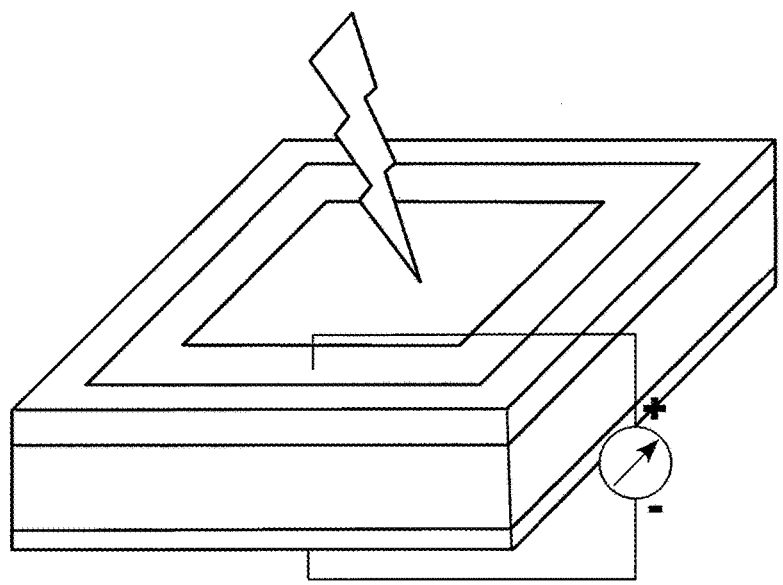
FIG. 1 illustrates a known Bismuth-Tellurium on Silicon photodiode.
Figure 2:
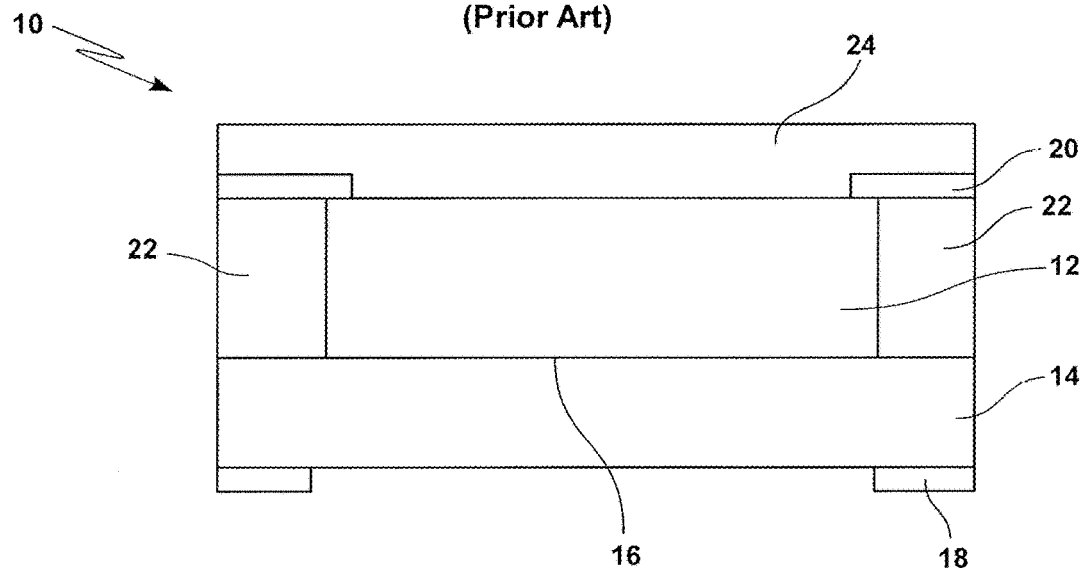
FIG. 2 illustrates a photodetector according to an embodiment of this presentation.

FIG. 2 illustrates a cross-section of a photodetector 10 according to an embodiment of this presentation, comprising a region 12 of a p-type phase-change chalcogenide material, arranged in contact with a region 14 of n-type Silicon so as to form a heterojunction 16 with region 14. According to an embodiment, the n-type Silicon has electrons as a major carrier and can be formed with extrinsic doping with Group V elements such as phosphorus, arsenic, and antimony (for example with a density of $10^{19}$ per $cm^3$). The p-type phase-change chalcogenide material has holes as a major carrier and the p-type is intrinsically formed by Ge-site vacancies in general. According to an embodiment of this presentation, the p-type phase-change chalcogenide material of region 12 comprises one of GeTe (for example Ge0.5Te0.5) and SbTe (for example Sb2Te3). According to an embodiment of this presentation, the p-type phase-change chalcogenide material of region 12 is crystalline or polycrystalline. According to an embodiment of this presentation, photodetector 10 operates in the near-IR and short-wave IR spectral ranges. According to an embodiment of this presentation, the region 12 has a thickness comprised between 0.2 μm and 1 μm; for example a thickness of 0.6 or 1 micrometer. According to an embodiment of this presentation, the material of region 14 can comprise Si. According to an embodiment of this presentation, region 12 comprises a bottom surface that is in contact with a top surface of the region 14; a portion of a bottom surface of the region 14 is in contact with a first electrode 18; and a portion of a top surface of region 12 is in contact with a second electrode 20. According to an embodiment of this presentation, region 12 comprises lateral sides that are surrounded by a dielectric material region 22; for example SiO2. According to an embodiment of this presentation, second electrode 20 is in contact with a portion of a top surface of said dielectric material region 22. Electrode 20 can be made of an optically transparent conductive material, including graphene or a network of silver nanowires.

According to an embodiment of this presentation, dielectric material region 22 can comprise SiO2 or silicon nitride (SiNx) and can be formed as a blanket dielectric layer over a Silicon substrate comprising region 14. The blanket dielectric layer can then be etched away from a predetermined region above region 14, thus forming a recess surrounded by dielectric layer 22, before forming region 12 in said recess and forming electrode 20 above at least a portion of region 12. According to an embodiment of this presentation, at least the portion of the top surface of region 12 that is not in contact with the second electrode 20 is covered by an anti-reflection coating 24. According to an embodiment of this presentation, anti-reflection coating 24 can comprise Ge or ZnSe coating as an example.

According to an embodiment of this presentation, region 12 can be formed directly on top of region 14 by: sputtering at room temperature a layer of an amorphous p-type phase-change chalcogenide material e.g. (GeTe, such as Ge0.5Te0.5; or Sb2Te3) on the top surface of region 14; then increasing the temperature until structural phase transition transforms the layer of amorphous p-type phase-change chalcogenide material into region 14, which comprises either a layer of crystalline p-type phase-change chalcogenide material or a layer of polycrystalline p-type phase-change chalcogenide material. According to an embodiment of this presentation, the phase transition temperature of the p-type phase-change chalcogenide material is low enough that increasing the temperature until structural phase transition takes place and forms region 14 does for example not damage an integrated circuit such as a CMOS circuit previously formed on a surface of region 14. The circuit can for example be a Readout Integrated Circuit (ROIC). Thus, and as detailed hereafter, a photodetector according to an embodiment of this presentation can be integrated directly to a CMOS circuit without requiring any hybridization process (as required for known crystalline semiconductors IR photodetectors). Thus, an embodiment of this presentation provides for fabricating chalcogenide photodiodes directly on CMOS wafers without requiring a hybridization process, which allows reducing the cost of imagers, and allows obtaining larger wafer-size scaling.

Figure 3:
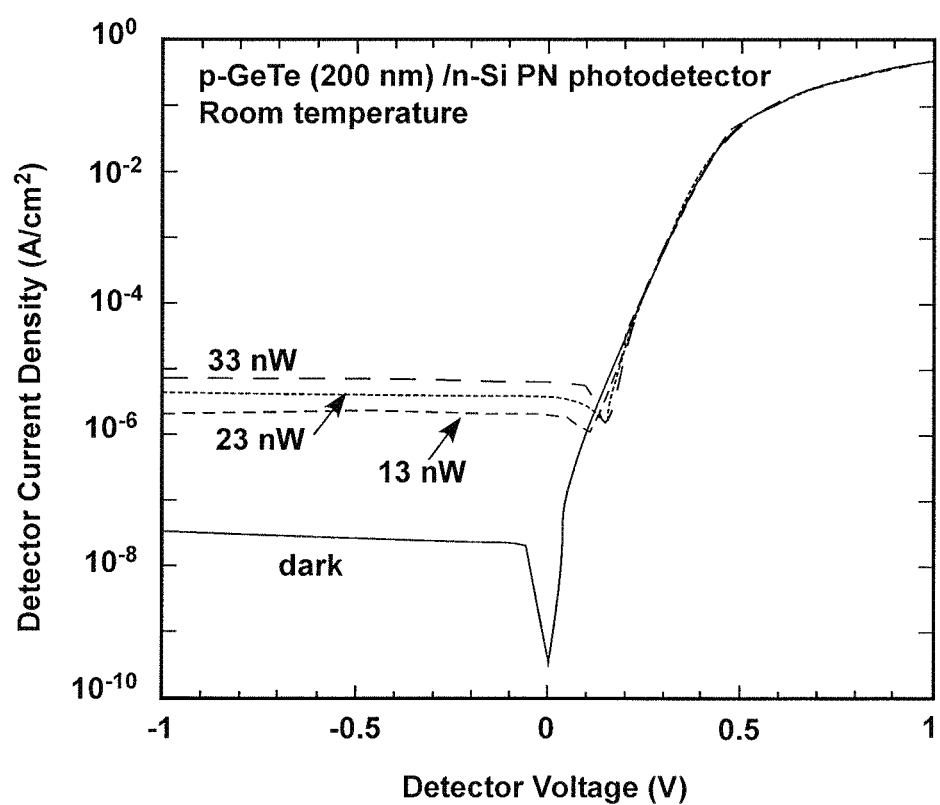
FIG. 3 illustrates the I/V characteristic of a photodetector according to an embodiment of this presentation.
Figure 4:
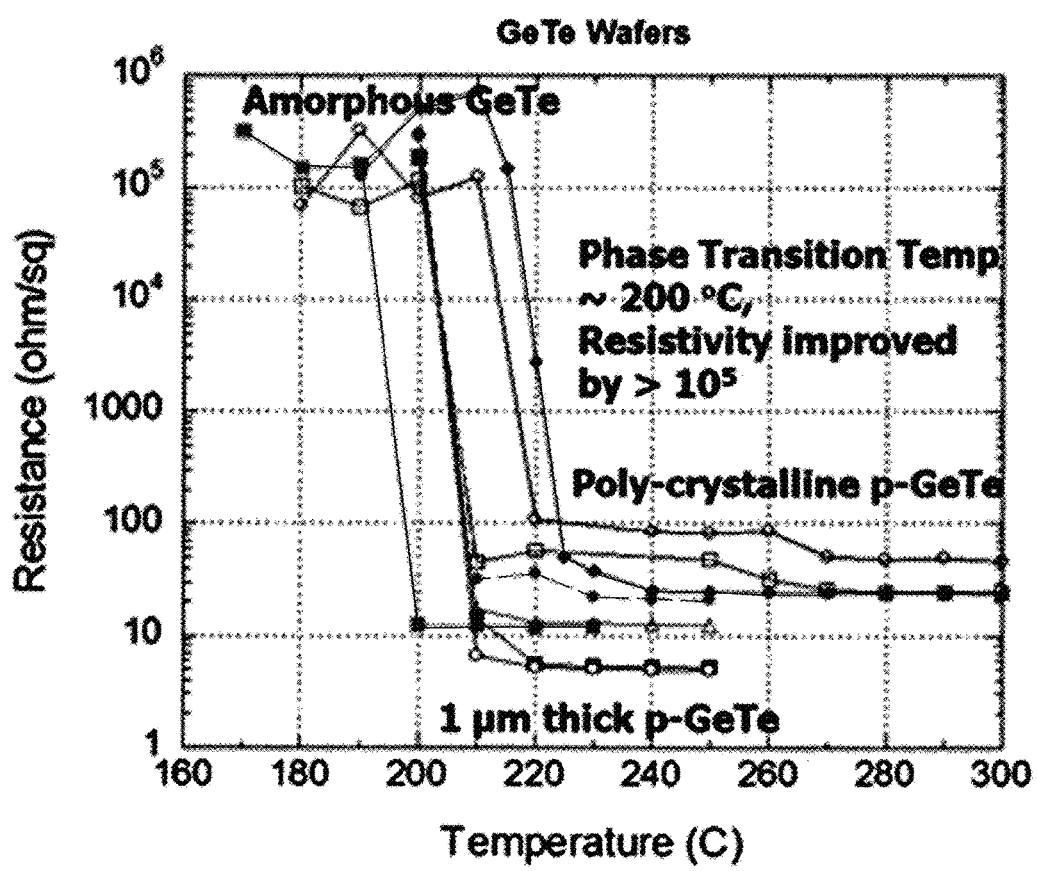
FIG. 4 illustrates the electrical resistance/temperature characteristic of a region of a p-type phase-change chalcogenide material according to an embodiment of this presentation.

FIG. 3 illustrates measured current-voltage characteristics of a 73×73 square micrometer p-GeTe/n-Si heterojunction photodetectors (using a GeTe thickness of 2000A) at room temperature after the GeTe was phase-transitioned to a poly-crystalline state by annealing at 200° C. It can be seen from FIG. 3 that the photocurrent of the photodiode/photodetector increases as the IR illumination intensity increases from 13 nW to 33 nW. It is noted that GeTe has a large band gap of 0.8 eV (amorphous) and 0.7 eV (crystalline) at room temperature FIG. 4 maps measured resistance versus temperature characteristics for a GeTe layer formed on a Si wafer/region 5 according to an embodiment of this presentation (various colors represent different doping concentrations). As illustrated the phase transition, from an amorphous state to a polycrystalline state, occurs when the chalcogenide is annealed at around 200° C. (in a range comprised between 190 and 230 degree Celsius). As illustrated in FIG. 4, a crystallized region of p-type phase-change chalcogenide material, according to embodiments of this presentation, is formed by annealing an amorphous region of the material at the phase transition temperature. FIG. 4 shows a resistance greater than $10^5$ Ohms per square units (such as sq meter or sq cm) for amorphous material and 10 ohms per square for poly-crystalline material. Further, a crystallized region of p-type phase-change chalcogenide material according to embodiments of this presentation had an excellent DC conductivity of around 3000 Siemens/cm. Further a crystallized region of p-type phase-change chalcogenide material according to embodiments of this presentation shows, for some doping concentrations, a p-type carrier mobility as high as 1400 $cm^2$/Volt-second.

Figure 5:
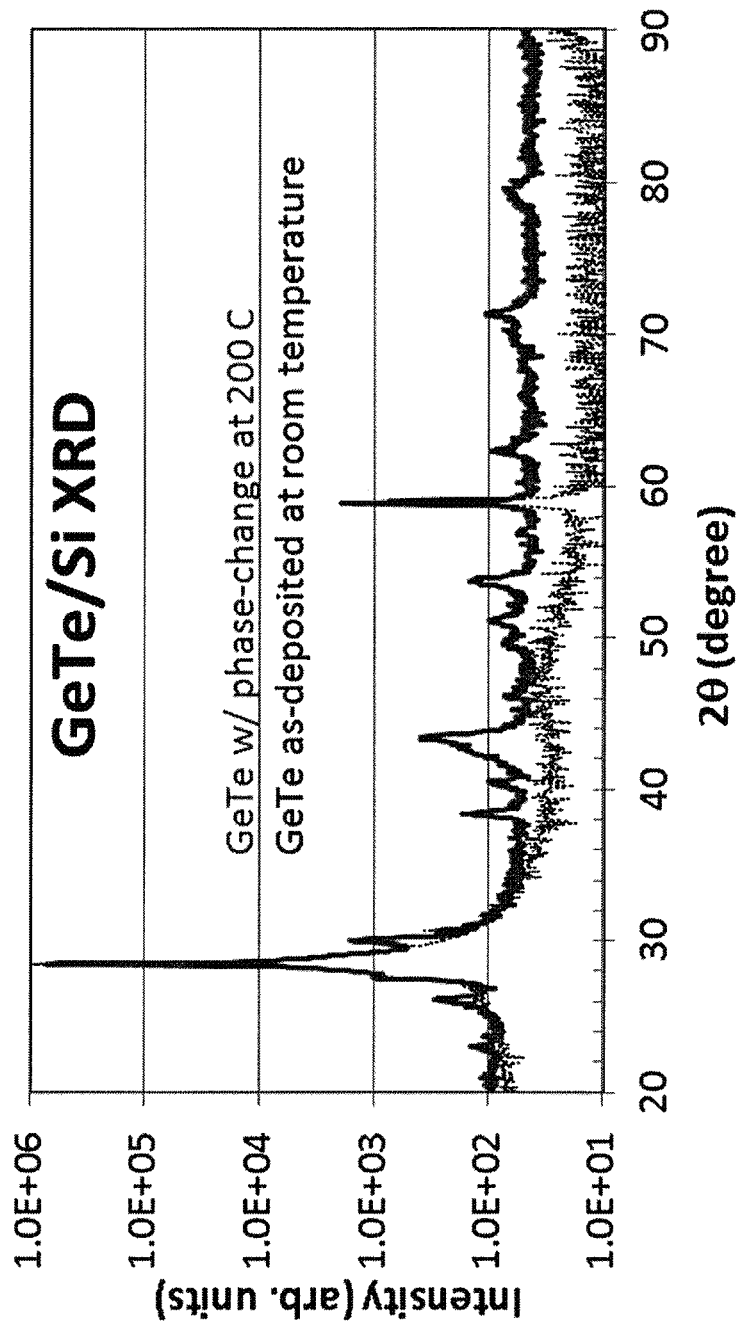
FIG. 5 illustrates X-ray diffraction data showing the change in crystallinity of a region of a p-type phase-change chalcogenide material according to an embodiment of this presentation with phase-transition.

FIG. 5 illustrates a measured intensity of X-Ray Diffraction as a function of an incidence angle θ of the X-ray on a phase-change chalcogenide material region GeTe according to an embodiment of this presentation.

Figure 6:
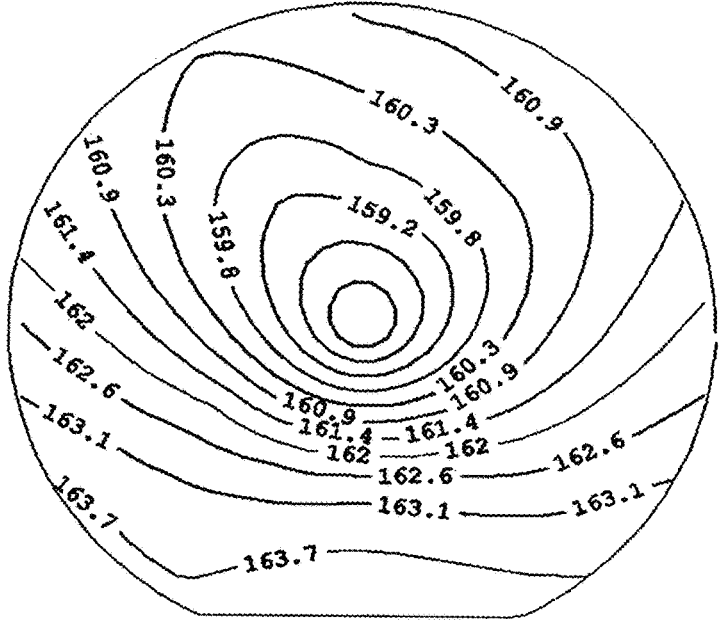
FIG. 6 illustrates the sheet resistance of a wafer of a p-type phase-change chalcogenide material according to an embodiment of this presentation.

FIG. 6 illustrates measured resistivity contours on an Antimony-Tellurium ($Sb_2Te_3$) region formed according to an embodiment of this presentation on a 3-inch Silicon wafer by raising the temperature of a room-temperature-sputtered amorphous layer to a phase transition temperature of about 160 degree C. As illustrated in FIG. 6, the sheet resistance of the illustrated Antimony-Tellurium ($Sb_2Te_3$) region is around 161 Ω/square meter, and it has a carrier mobility of about 272 $cm^2$/V-Sec. As illustrated in FIG. 6, a p-doped Antimony-Tellurium ($Sb_2Te_3$) is also a suitable chalcogenide on the n-doped Silicon region forming a heterojunction suitable for a photodiode.

Figure 7:
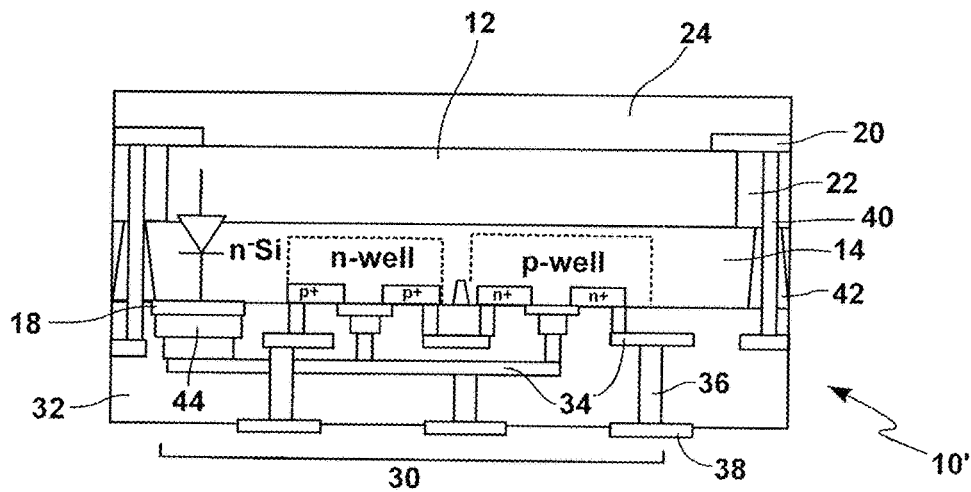
FIG. 7 illustrates schematically a photodetector according to an embodiment of this presentation.

FIG. 7 illustrates an embodiment of a phase-change chalcogenide photodiode device/photodetector 10', which comprises all the elements described in relation with the photodiode 10 in FIG. 2. Further, photodetector 10' comprises an integrated circuit 30 formed at least in part in a portion of the bottom surface of the region 14 of n-type Silicon, circuit 30 being connected to first electrode 18. According to an embodiment of this presentation, integrated circuit 30 can be a CMOS circuit, for example a ROIC circuit. A CMOS inverter comprising a PMOS transistor and a NMOS transistor, respectfully in an n-well and a p-well formed each in the bottom surface of region 14, is illustrated in FIG. 7. As illustrated in FIG. 7, the bottom surface of region 14 can be covered by a dielectric layer 32 and said dielectric layer can comprise conductor strips 34 forming electrical connections of integrated circuit 30. The conductor strips 34 can be connected together using vias 36 formed in dielectric layer 32. Circuit 30 can be connected to pads 38 formed on a bottom surface (illustrated) or a lateral surface (not shown) of dielectric layer 32.

According to an embodiment of this presentation, electrode 20 can be electrically connected to integrated circuity by a via 40. Via 40 can be formed through dielectric region 22 so as to be isolated from region 12, and can be formed through a dielectric region 42 traversing region 14 so as to be isolated from region 14. According to an embodiment of this presentation, integrated circuit 30 can comprise a capacitor 44 formed of two conductor strips 34 separated by a thin dielectric layer. According to an embodiment of this presentation (illustrated hereafter) a bottom surface of dielectric layer 32 can be attached to a carrier wafer. FIG. 7 also illustrates schematically the naked electrical photodiode formed by the heterojunction between regions 12 and 14. It is noted that the term "region" as used here can be equated to the term "layer" where appropriate.

FIGS. 8A to 8B illustrate a method, according to an embodiment of this presentation, of manufacturing a photodetector such as illustrated in FIG. 7.

As illustrated in FIG. 8A, the method comprises providing a first substrate 50 having a work surface 52; and forming on work surface 52 the region 14 of n-type Silicon. The work surface 52 of substrate 50 can comprise an insulator region 54 and region 14 can be a layer of Silicon-on-insulator. It is noted that, at this stage of manufacturing, the final top surface of region 14 is in contact with the work surface of the substrate and the final bottom surface of region 14 is exposed. According to an embodiment of this presentation, the method then comprises forming integrated circuit 30 in the exposed surface of region 14; said integrated circuit being electrically coupled to a first electrode of said photodetector. It is noted that circuit 30 can be formed using known CMOS manufacturing processes. As outlined above, a layer 32 of dielectric can be formed above the exposed layer of region 14 and can comprise conductive strips 34 and/or vias 36 connected to or forming part of integrated circuit 30.

As illustrated in FIG. 8B, the method then comprises attaching a attaching a second substrate 60 to the top of region 14 (or on top of dielectric layer 32 when dielectric layer 32 is formed, as illustrated). According to an embodiment of this presentation, substrate 60 can be attached permanently (to manufacture a more rigid final product) or removably (to manufacture a less rigid final product).

As illustrated in FIGS. 8C and 8D, the method then comprises removing the first substrate 50, for example by etching and polishing. Removing substrate 50 exposes a surface of region 14 that is the final top surface of region 14. In the illustrated embodiment, where substrate 50 comprised an insulator 54, the carrier part of substrate 50 is first removed in FIG. 8C and then the insulator 54 is removed in FIG. 8D. As also illustrated in FIG. 8C, a plurality of regions 14 can be formed out of a single original region 14, for example by forming dielectric separator wells 42. Separator wells 42 can be formed at this stage or they can be formed earlier at the time of manufacturing integrated circuit 30.

As illustrated in FIG. 8E, the method then comprises forming a layer 62 of an amorphous p-type phase-change chalcogenide material on the top surface of region 14. According to an embodiment of this presentation, layer 62 is formed at room temperature, for example by sputtering. The method further comprises annealing at 200 degrees C. until a structural phase transition of layer 62 transforms the layer 62 of amorphous p-type phase-change chalcogenide material into one of a layer of crystalline p-type phase-change chalcogenide material and a layer of polycrystalline p-type phase-change chalcogenide material. According to an embodiment of this presentation, the material of region 12 is chosen such that its structural phase transition temperature does not damage the rest of the circuit, in particular integrated circuit 30. As illustrated in FIG. 8E, layer 62' can then be etched to form regions 12 above corresponding regions 14, for example opening a space above the dielectric separator wells 42.

As illustrated in FIG. 8F, dielectric regions 22 can then be formed in the space above the dielectric separator wells 42 and a via 40 can be formed through dielectric regions 22 and dielectric separator wells 42 to contact a conductor 34 of integrated circuit 30. According to an embodiment of this presentation, electrodes 20 can be formed, for example to contact via 40 to the top surface of region 14 of p-type phase-change chalcogenide material. According to an embodiment of this presentation, an anti-reflection material, for example Ge or ZnSe, can then be formed on the top surface of the photodetector. Substrate 60 can then be kept (as illustrated) to make photodetector 10' more rigid, or can be removed (as shown in FIG. 7) to make photodetector 10' less rigid.

As detailed above, alternatively to what is shown in FIG. 8D, a dielectric layer can be formed on the top surface of region 14 before region 12 is formed. The dielectric layer is then etched to form the dielectric regions 22 around a recess, and region 12 is formed in the recess.

As demonstrated with the measured performance data in the figures presented above, the various embodiments presented herein offer low-cost high performance IR photodetectors suitable for many applications for use as sensors and cameras operating in NIR or SWIR spectral range. Although GeTe and SbTe are demonstrated as preferred chalcogenides, other chalcogenides can be used as well in a similar fashion.

As detailed above, the disclosed phase-change chalcogenide/n-Si heterojunction photodiodes can be integrated with conventional silicon CMOS or SOI process, potentially enabling low-cost NIR and SWIR detectors.

In particular configurations, it may be desirable to have p-GeTe on n-Si as the preferred hetero-junction. In other applications, p-SbTe on n-Si may be the preferred hetero-junction for the photodiode.

Modifications, additions, or omissions may be made to the systems, apparatuses, and methods described herein without departing from the scope of the inventive concepts. The components of the systems and apparatuses may be integrated or separated. Moreover, the operations of the systems and apparatuses may be performed by more, fewer, or other components. The methods may include more, fewer, or other steps. Additionally, steps may be performed in any suitable order. As used in this document, "each" refers to each member of a set or each member of a subset of a set.

To aid the Patent Office, and any readers of any patent issued on this application in interpreting the claims appended hereto, applicants wish to note that they do not intend any of the appended claims or claim elements to invoke paragraph 6 of 35 U.S.C. Section 112 as it exists on the date of filing hereof unless the words "means for" or "step for" are explicitly used in the particular claim.

What is claimed is:

1. A method of manufacturing a photodetector, the method comprising:
   providing a region of n-type Silicon having top and bottom surfaces;
   forming one of a layer of crystalline p-type phase-change chalcogenide material and a layer of polycrystalline p-type phase-change chalcogenide material on the top surface of the region of n-type Silicon;
   wherein the p-type phase-change chalcogenide material comprises one of GeTe and SbTe.

2. The method of claim 1, wherein said forming one of a layer of crystalline p-type phase-change chalcogenide material and a layer of polycrystalline p-type phase-change chalcogenide material on the top surface of the region of n-type Silicon comprises:
   sputtering at room temperature a layer of an amorphous p-type phase-change chalcogenide material on the top surface of the region of n-type Silicon; and
   increasing the temperature until structural phase transition transforms the layer of amorphous p-type phase-change chalcogenide material into one of a layer of crystalline p-type phase-change chalcogenide material and a layer of polycrystalline p-type phase-change chalcogenide material.

3. The method of claim 1, wherein said providing a region of n-type Silicon having top and bottom surfaces comprises:
   providing a first substrate having a work surface; and
   forming said region of n-type Silicon on said work surface of the first substrate, wherein the top surface of said region of n-type Silicon is in contact with the work surface of the substrate and the bottom surface of said region of n-type Silicon is exposed;
   forming an integrated circuit in the bottom surface of said region of n-type Silicon; said integrated circuit being electrically coupled to a first electrode of said photodetector;
   forming a dielectric layer on the bottom surface of said region of n-type Silicon;
   attaching a second substrate to the dielectric layer; and
   removing the first substrate to expose the top surface of said region of n-type Silicon.

4. The method of claim 3, wherein said dielectric layer comprises at least one conductor electrically connected to said integrated circuit.

5. The method of claim 3, further comprising forming an insulated via between said integrated circuit and a top surface of the p-type phase-change chalcogenide material; and forming on the top surface of the p-type phase-change chalcogenide material a second electrode of said photodetector in contact with the via.

6. The method of claim 1, further comprising covering the layer of p-type phase-change chalcogenide material with an anti-reflection material.

7. The method of claim 6, wherein the anti-reflection coating comprises Ge or ZnSe.

8. A method of manufacturing a photodetector, the method comprising:
   providing a region of n-type Silicon having top and bottom surfaces;
   forming one of a layer of crystalline p-type phase-change chalcogenide material and a layer of polycrystalline p-type phase-change chalcogenide material on the top surface and in direct contact with of the region of n-type Silicon.

9. The method of claim 8, wherein said forming one of a layer of crystalline p-type phase-change chalcogenide material and a layer of polycrystalline p-type phase-change chalcogenide material on the top surface of the region of n-type Silicon comprises:
   sputtering at room temperature a layer of an amorphous p-type phase-change chalcogenide material on the top surface of the region of n-type Silicon; and
   increasing the temperature until structural phase transition transforms the layer of amorphous p-type phase-change chalcogenide material into one of a layer of crystalline p-type phase-change chalcogenide material and a layer of polycrystalline p-type phase-change chalcogenide material.

10. The method of claim 8, wherein the p-type phase-change chalcogenide material comprises one of GeTe and SbTe.

11. The method of claim 8, wherein said providing a region of n-type Silicon having top and bottom surfaces comprises:

provriding a first substrate having a work surface; and
forming said region of n-type Silicon on said work surface of the first substrate, wherein the top surface of said region of n-type Silicon is in contact with the work surface of the substrate and the bottom surface of said region of n-type Silicon is exposed;
forming an integrated circuit in the bottom surface of said region of n-type Silicon; said integrated circuit being electrically coupled to a first electrode of said photodetector;
forming a dielectric layer on the bottom surface of said region of n-type Silicon;

attaching a second substrate to the dielectric layer; and
removing the first substrate to expose the top surface of said region of n-type Silicon.

12. The method of claim 10, wherein said dielectric layer comprises at least one conductor electrically connected to said integrated circuit.

13. The method of claim 10, further comprising forming an insulated via between said integrated circuit and a top surface of the p-type phase-change chalcogenide material; and forming on the top surface of the p-type phase-change chalcogenide material a second electrode of said photodetector in contact with the via.

14. The method of claim 8, further comprising covering the layer of p-type phase-change chalcogenide material with an anti-reflection material.

15. The method of claim 13, wherein the anti-reflection coating comprises Ge or ZnSe.

\* \* \* \* \*